United States Patent
Lei et al.

(10) Patent No.: US 8,323,859 B2
(45) Date of Patent: *Dec. 4, 2012

(54) OPTICAL COMPENSATION DEVICES, SYSTEMS, AND METHODS

(75) Inventors: Xinya Lei, Boise, ID (US); Fei Wang, Boise, ID (US); Pary Baluswamy, Bristow, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/299,888

(22) Filed: Nov. 18, 2011

(65) Prior Publication Data

US 2012/0064439 A1   Mar. 15, 2012

Related U.S. Application Data

(63) Continuation of application No. 12/872,732, filed on Aug. 31, 2010, now Pat. No. 8,062,814, which is a continuation of application No. 11/749,624, filed on May 16, 2007, now Pat. No. 7,790,338.

(51) Int. Cl.
  *G03F 1/30*   (2012.01)
(52) U.S. Cl. .......................................... 430/5
(58) Field of Classification Search .............. 430/5, 394; 716/50–55

See application file for complete search history.

(56) References Cited

U.S. PATENT DOCUMENTS

| | | | |
|---|---|---|---|
| 6,528,216 | B2 | 3/2003 | Park |
| 6,818,357 | B2 | 11/2004 | Yan |
| 7,790,338 | B2 | 9/2010 | Lei et al. |
| 8,062,814 | B2 | 11/2011 | Lei et al. |
| 2007/0238032 | A1 | 10/2007 | Murano |
| 2008/0284996 | A1 | 11/2008 | Lei et al. |
| 2010/0323283 | A1 | 12/2010 | Lei et al. |

OTHER PUBLICATIONS

Brunner, Timothy A., "Impact of Lens Aberrations on Optical Lithography", IBM J. Res. Develop. 41(1/2), (Jan./Mar. 1997), pp. 57-67.

*Primary Examiner* — Stephen Rosasco
(74) *Attorney, Agent, or Firm* — Schwegman, Lundberg & Woessner, P.A.

(57) ABSTRACT

Photolithographic apparatus, systems, and methods that make use of optical compensation devices are disclosed. In various embodiments, an imaging mask includes an optically transmissive substrate. A first patterned region is formed on the substrate, and a second patterned region is formed on the substrate that is proximate to the first patterned region, the first patterned region and the second patterned region each having a plurality of optically transmissive and optically attenuating regions formed on the mask. An optical compensation region is positioned proximate to at least one of the first patterned region and the second patterned region that is configured to change a phase of the illumination radiation incident on the at least one of the first patterned region and the second region by altering an optical property of the substrate.

20 Claims, 7 Drawing Sheets

OPTICAL COMPENSATION DEVICES, SYSTEMS, AND METHODS

RELATED APPLICATION

This application is a continuation of U.S. application Ser. No. 12/872,732, filed Aug. 31, 2010, now U.S. Pat. No. 8,062,814 which is a continuation of U.S. application Ser. No. 11/749,624, filed May 16, 2007, now issued as U.S. Pat. No. 7,790,338, both of which are incorporated herein by reference in their entirety.

TECHNICAL FIELD

The embodiments disclosed herein relate generally to photolithographic devices and methods, including optical compensation features for photolithographic masks used in sub-resolution photolithography.

BACKGROUND

The incorporation of increasing numbers of discrete devices into progressively smaller integrated circuits remains an important challenge in the manufacture of Very Large Scale Integration (VLSI) structures. For example, the implementation of complementary metal-oxide semiconductor (CMOS) technology into integrated circuits usually involves imparting a prescribed set of manufacturing attributes to the integrated circuit, such as selected dopant concentrations, channel lengths, interconnect dimensions, contact shapes, or other pertinent attributes, which collectively permit the integrated circuit to provide a desired function.

Many of the desired features in VLSI structures may be formed using photolithographic methods. Briefly, and in general terms, a photolithographic mask (or reticle) is formed that includes a desired pattern corresponding to a particular masking step for the structure. The pattern generally includes optically transparent areas and optically attenuating areas that are suitably arranged on an optically transparent supporting substrate. The mask may then be positioned proximate to an illumination system and a layer of an illumination-sensitive photoresist material applied to a semiconductor wafer. The illumination system projects illumination radiation through the optically transmissive portions of the mask and onto the photoresist material, which suitably changes the properties of the photoresist material. Subsequent development of the exposed photoresist material thus permits the selective differentiation between exposed and non-exposed areas in the photoresist material so that the desired pattern may be subsequently formed on the semiconductor wafer.

When a wavelength of the illumination radiation is greater than a minimum feature size expressed on the mask, various optical effects may adversely affect the quality of features formed on a semiconductor structure. For example, a mask used to form a memory device array may include patterns having different orientations, such as a first set of generally horizontal features in an array portion of the memory device, and a second set of generally vertical and/or mixed features in a peripheral logic region. Although the illumination system may permit the first set of features to be accurately resolved at a first focal distance, undesired optical aberrations (including, for example, astigmatism) in the illumination system generally permit the second set of resolvable features to be accurately resolved only at a second focal distance that is different from the first focal distance. In one commonly employed method, a focal distance is selected for the illumination system that is intermediate between the first focal distance and the second focal distance so that the first set and the second set of features are projected from the mask and onto the wafer to yield a device pattern on the wafer having a correspondingly intermediate pattern resolution. As device features continue to decrease in size, however, the foregoing optical compensation method may be unable to generate device patterns at an acceptable resolution level.

Therefore, there presently exists an urgent need in the art for optical compensation methods, systems, and devices applicable to sub-resolution photolithography that permit aggressive reductions in device feature size.

BRIEF DESCRIPTION OF THE DRAWINGS

Various embodiments of the invention are described in detail below with reference to the following drawings.

DETAILED DESCRIPTION

Various embodiments of the invention include photolithographic devices and systems having optical compensation devices for photolithographic masks used in photolithography, and methods of forming and using such optical compensation devices. Specific details of several embodiments of the invention are set forth in the following description and in FIGS. 1 through 12 to provide a thorough understanding of such embodiments. One of ordinary skill in the art, however, will understand that additional embodiments are possible, and that many embodiments may be practiced without several of the details described in the following description.

Figure 1:
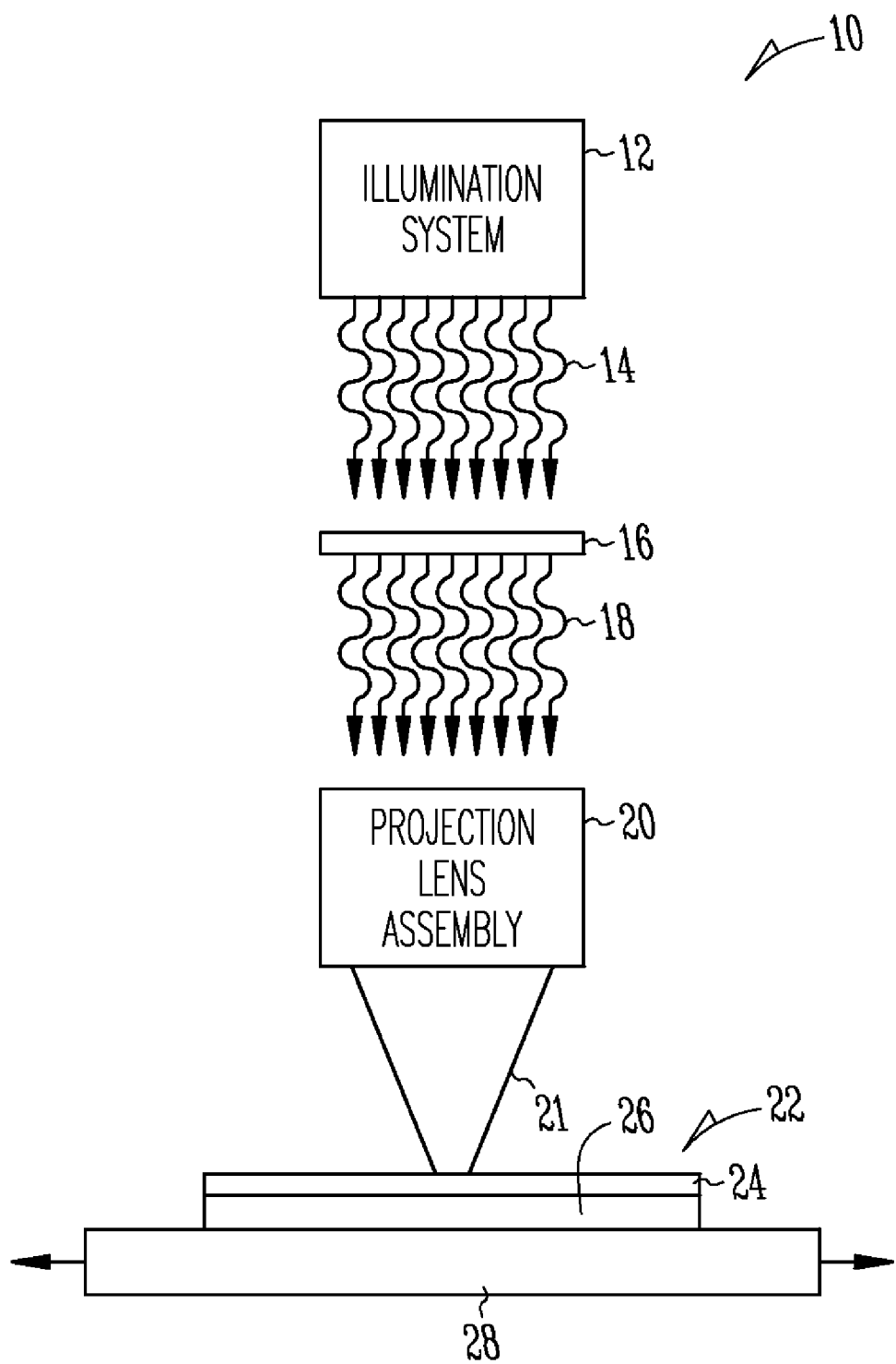
FIG. 1 is a diagrammatic block view of a photolithography system according to the various embodiments.

FIG. 1 is a diagrammatic block view of a photolithography system 10, according to the various embodiments. The system 10 includes an illumination system 12 that is configured to emit illumination radiation 14 that may be used for photolithographic imaging. Accordingly, the system 10 may include illumination sources (not shown) that are operable to generate radiation 14 in the deep ultraviolet (DUV) portion of the spectrum, such as an excimer laser. Suitable excimer laser sources may include a xenon-fluoride (XeF) device that emits radiation at a wavelength of 351 nanometers (nm), a xenon-chloride (XeCl) device that emits radiation at a wavelength of 308 nm, a krypton-fluoride (KrF) device that emits radiation at a wavelength of 248 nanometers (nm), and an argon-fluoride (ArF) that emits radiation at a 193 nm wavelength. Other suitable illumination sources may include mercury-arc sources that emit at wavelengths of about 365 nm to 257 nm, depending on the spectral line selected. In addition to the foregoing wavelengths, still other wavelengths may also be used.

The illumination system 12 may also include devices that provide off-axis illumination corresponding to a selected illumination mode. For example, suitable devices may be configured to generate a dipole-type illumination mode, an annular illumination mode, a two-pole illumination mode, a four pole illumination mode, or still other illumination modes. The illumination system 12 may also include other optical devices that are operable to produce illumination radiation 14 having a desired intensity and/or distribution.

The illumination system 12 may be positioned relative to an imaging mask 16, so that the illumination radiation 14 emitted from the system 12 is projected onto the imaging mask 16. The imaging illumination 18 corresponds to the radiation 14 that is selectively transmitted by the imaging mask 16. The imaging mask 16 may include an optically transmissive substrate material, such as a fused quartz substrate, although other suitable materials, such as soda-lime glass and borosilicate glass may also be used.

The imaging mask 16 may also include optical attenuation areas formed from various compounds that may include selected combinations of chromium, oxygen and nitrogen. Alternatively, the optical attenuation areas may also include selected combinations of molybdenum, silicon, oxygen and nitrogen. Other suitable materials are known in the art, which may also be used to form the optical attenuation areas on the optically transmissive substrate material. The mask 16 may also include optical compensation regions according to the various embodiments, as will be discussed in greater detail below.

The system 10 may further include a projection lens assembly 20 that is configured to collect the imaging illumination 18 and form focused imaging illumination 21 therefrom. The focused imaging illumination 21 may then be directed onto an in-process semiconductor structure 22. The structure 22 may include a photoresist layer 24 that is responsive to the illumination 21, which is applied to a surface of a semiconductor wafer 26. Since the photoresist layer 24 may be repetitively exposed to the focused imaging illumination 21 to form separately exposed areas on the wafer 26, the semiconductor structure 22 may be positioned upon a stage 28 that may be translated in one or more of several (e.g., three) mutually-orthogonal directions.

Figure 2:
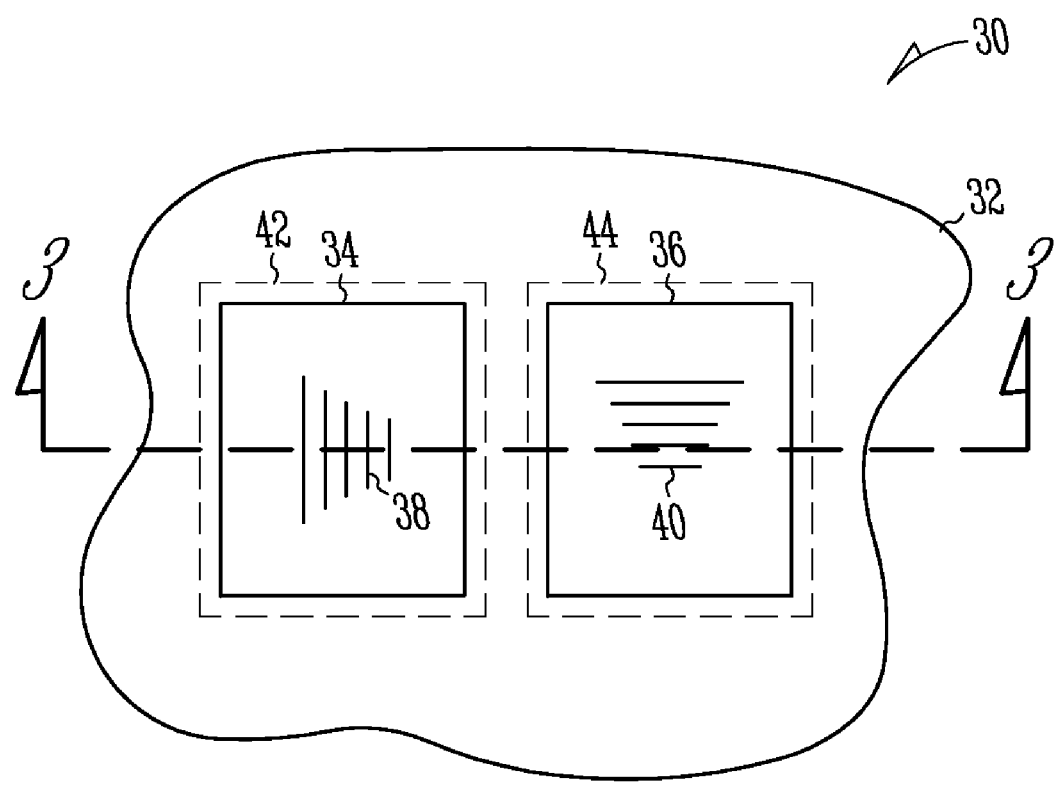
FIG. 2 is a partial plan view of an imaging mask according to the various embodiments.

FIG. 2 is a partial plan view of an imaging mask 30 according to the various embodiments. The imaging mask 30 may include a substantially plane-parallel and optically transmissive substrate 32 that may further include one or more patterned regions disposed on a surface of the substrate 32 that correspond to functional features of a desired microelectronic device. Accordingly, the patterned regions generally include a plurality of optically transmissive areas interspersed with optical attenuation areas. The optical attenuation areas may therefore include a radiation-absorbing layer deposited on the substrate 32 that is comprised of chromium and/or tantalum. Alternately, a metal silicide layer may be deposited on the substrate 32 to form the optical attenuation areas. One suitable metal silicide is molybdenum silicide, although others may also be used. In either case, the optical attenuation areas provide a predetermined reflectance to incident illumination radiation 14 (as shown in FIG. 1). Other layers may also be present on the substrate 32, such as a backside coating that protects an opposing side of the substrate 32 from damage resulting from contact with the stage 28 (as also shown in FIG. 1), and a resist layer to assist in the formation of the optical attenuation areas on the substrate 32. One suitable substrate 32 is the Full Extreme Ultraviolet Lithography (EUV) mask blank, which may be obtained from Schott Lithotec USA of Poughkeepsie, N.Y., although other suitable alternatives exist.

The imaging mask 30 also includes at least a first patterned region 34 and a second patterned region 36 that may be spaced apart from the first patterned region 34, although the first patterned region 34 and the second patterned region 36 may also be at least partially abutting. The first patterned region 34 may also include first features 38 that are generally oriented in a first direction, while the second patterned region 36 may include second features 40 that are generally oriented in a second direction. Although FIG. 2 shows the first features 38 of the first patterned region 34 and the second features 40 of the second patterned region 36 being approximately mutually perpendicular, it is understood that the first features 38 and the second features 40 may be oriented at any relative angular orientation, including substantially parallel.

The imaging mask 30 may also include a first optical compensation region 42 that is positioned proximate to the first patterned region 34, and a second optical compensation region 44 that is positioned proximate to the second patterned region 36. Although FIG. 2 shows the first optical compensation region 42 and the second optical compensation region 44 positioned proximate to respective first patterned region 34 and second patterned region 36, it is understood that one of the first optical compensation region 42 and the second optical compensation region 44 may be omitted in some embodiments. The first optical compensation region 42 and the second optical compensation region 44 may be optically configured to alter a phase of the illumination radiation 14 that is incident on the mask 30. For example, at least one of the first optical compensation region 42 and the second optical compensation region 44 may be configured to provide a phase shift that is greater than approximately zero degrees (zero radians), but less than approximately 180 degrees ($\pi$ radians). At least one of the first optical compensation region 42 and the second optical compensation region 44 may also be configured to provide a phase shift that is greater than approximately 180 degrees ($\pi$ radians), but less than approximately 360 degrees ($2\pi$ radians). In other embodiments, at least one of the first optical compensation region 42 and the second optical compensation region 44 may be configured to shift the phase of the illumination radiation 14 (FIG. 1) by approximately about 90 degrees ($\pi/2$ radians). The first optical compensation region 42 and the second optical compensation region 44 will be discussed in further detail below.

Figure 3:
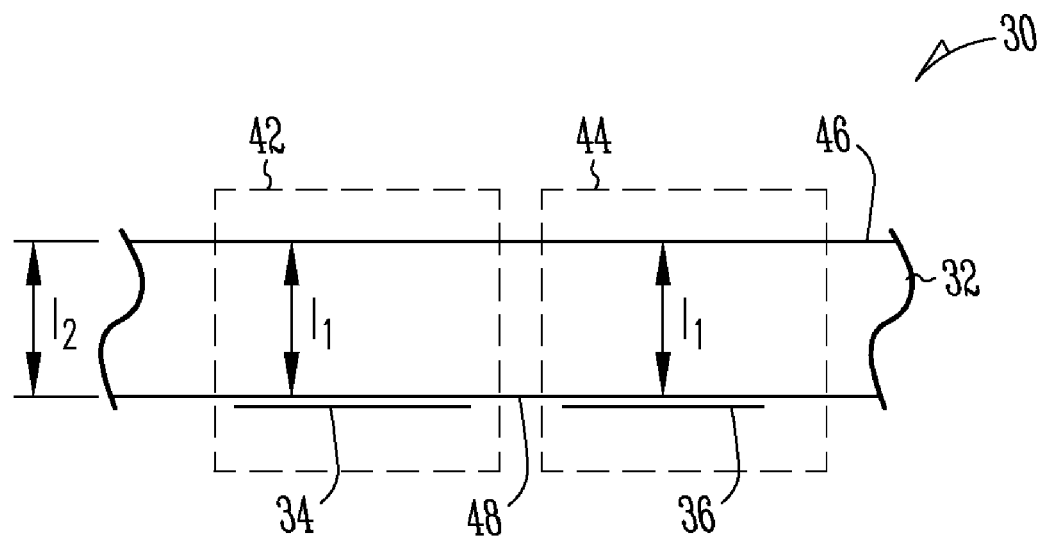
FIG. 3 is a partial cross-sectional view of the imaging mask along the cross section 3-3 indicated in FIG. 2.

FIG. 3 is a partial cross-sectional view of the imaging mask 30 along the cross section 3-3 indicated in FIG. 2, which will be used to further describe the first optical compensation region 42 and the second optical compensation region 44. The first optical compensation region 42 and the second optical compensation region 44 may be incorporated into various portions of a substrate 32. For example, the first optical compensation region 42 and the second optical compensation region 44 may be positioned on a first surface 46 of the substrate 32, and/or on a second surface 48 so that an optical path length $l_1$ in at least one of the first optical compensation region 42 and the second optical compensation region 44 is increased in comparison to an optical path length $l_2$ corresponding to other unaltered portions of the substrate 32. In other of the various embodiments, at least one of the first optical compensation region 42 and the second optical compensation region 44 may also include portions that extend inwardly into the substrate 32 to form recesses projecting into at least one of the first surface 46 and the second surface 48, so that the optical path length $l_1$ is decreased in comparison to the optical path length $l_2$. In still other of the various embodiments, at least one of the first optical compensation region 42 and the second optical compensation region 44 may be formed by physically altering a predetermined optical property within the substrate 32.

Figure 4:
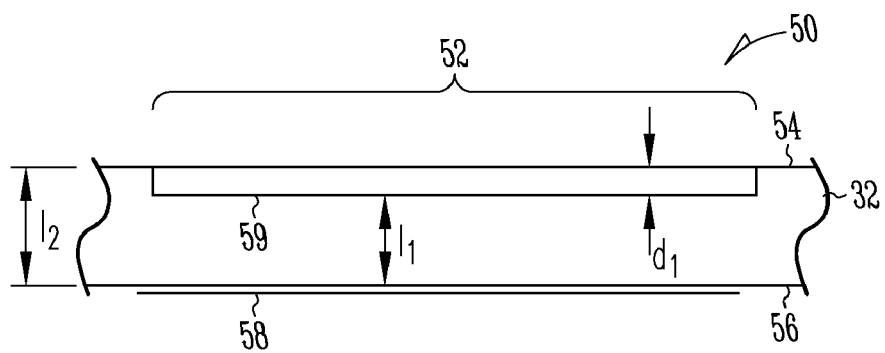
FIG. 4 is a partial cross-sectional view of an imaging mask according to the various embodiments.

FIG. 4 is a partial cross-sectional view of an imaging mask 50 according to the various embodiments. In the discussion that follows, and in the interest of brevity, only a single optical compensation region will be illustrated and discussed. It is understood, however, that the various embodiments may include one or more optical compensation regions. Thus, the imaging mask 50 may include at least one optical compensation region 52 that projects inwardly into the substrate 32 a distance $d_1$ from a first side 54 that opposes a second side 56 that also includes a patterned region 58. Accordingly, an inner optical surface 59 is formed within the substrate 32, which may be positioned at a predetermined position between the first side 54 and a second side 56 of the substrate 32 to provide a negative phase shift relative to a phase of the illumination radiation 14 (see FIG. 1).

In general, a distance d for the optical compensation region 52 may be determined using the following expression:

$$d = 2\lambda/\pi(n-1) \quad (1)$$

where n is the index of refraction for the substrate 32, and $\lambda$ corresponds to a wavelength of the illumination radiation 14 (as shown in FIG. 1). The inner optical surface 59 may be formed in the substrate 32 using either a wet etch or a dry etch method. For example, the inner optical surface 59 may be formed using a plasma etch process, although other suitable methods may also be used.

Figure 5:
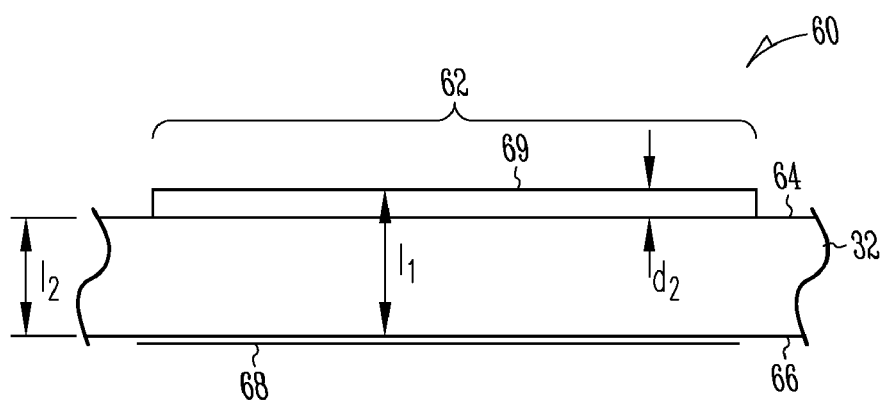
FIG. 5 is a partial cross-sectional view of another imaging mask according to the various embodiments.

FIG. 5 is a partial cross-sectional view of another imaging mask 60 according to the various embodiments. The imaging mask 60 may include at least one optical compensation region 62 that projects outwardly from the substrate 32 a distance $d_2$ from a first side 64 that opposes a second side 66 that also includes a patterned region 68. Accordingly, an outer optical surface 69 is formed on the substrate 32, which may be positioned at a predetermined position beyond the first side 64 of the substrate 32 to provide a positive phase shift relative to a phase of the illumination radiation 14 (see FIG. 1). The distance $d_2$ for the optical compensation region 62 may be determined using the expression (1) given above. The outer optical surface 64 may be formed using various deposition processes known in the art.

Figure 6:
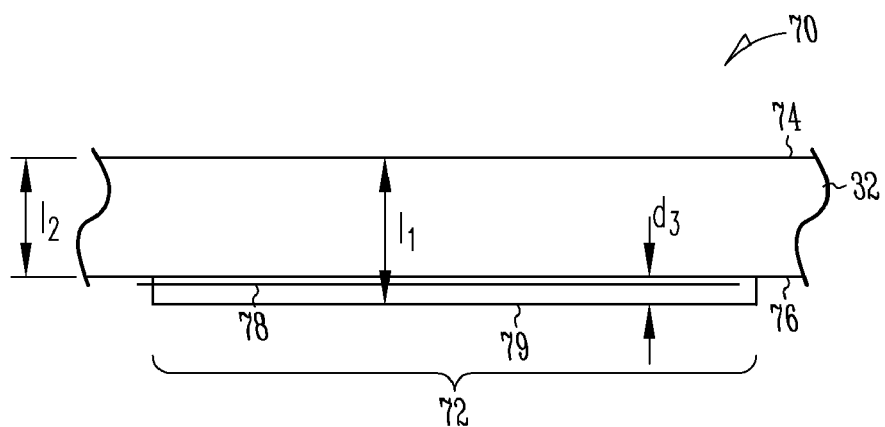
FIG. 6 is a partial cross-sectional view of still another imaging mask according to the various embodiments.

FIG. 6 is a partial cross-sectional view of still another imaging mask 70 according to the various embodiments. The imaging mask 70 may include at least one optical compensation region 72 that projects outwardly from the substrate 32 a distance $d_3$ from a second side 76 that opposes a first side 74. Accordingly, the optical compensation region 72 may be at least partially applied on a patterned region 78 to define an outer optical surface 79 formed on the substrate 32 so that a positive phase shift relative to a phase of the illumination radiation 14 is provided. The distance $d_3$ for the optical compensation region 72 may similarly be determined using expression (1) above.

Figure 7:
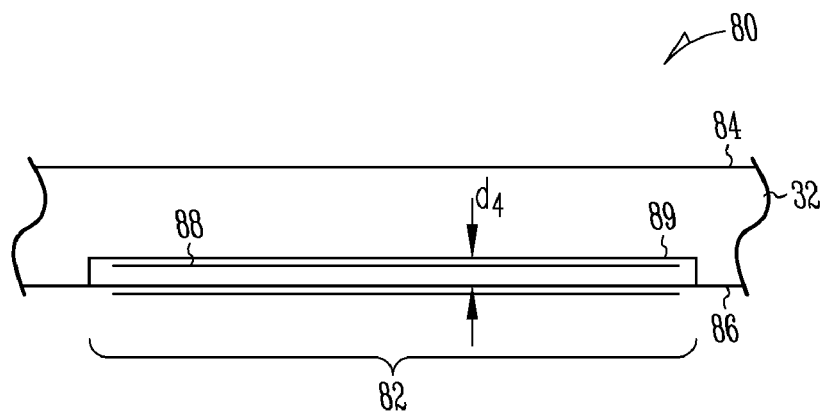
FIG. 7 is a partial cross-sectional view of still yet another imaging mask according to the various embodiments.

FIG. 7 is a partial cross-sectional view of still yet another imaging mask 80 according to the various embodiments. The imaging mask 80 may also include at least one optical compensation region 82 that projects inwardly into the substrate 32 a distance $d_4$ from a second side 86 that opposes a first side 84 to define an inner optical surface 89 formed within the substrate 32. Accordingly, a negative phase shift relative to a phase of the illumination radiation 14 (see FIG. 1) may be provided. A patterned region 88 may be applied to the inner optical surface 89. The distance $d_4$ for the optical compensation region 82 may be determined as described above.

Figure 8:
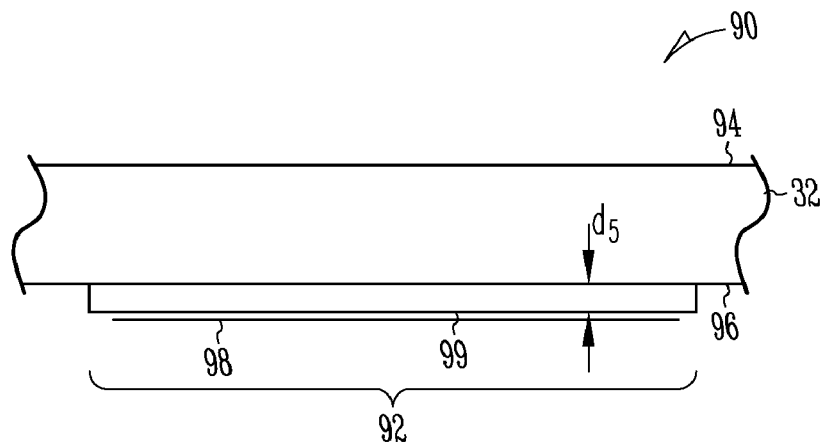
FIG. 8 is a partial cross-sectional view of an imaging mask according to the various embodiments.

FIG. 8 is a partial cross-sectional view of an imaging mask 90 according to the various embodiments. The imaging mask 90 may include an optical compensation region 92 that projects outwardly from the substrate 32 a distance $d_5$ from a second side 96 that opposes a first side 94. Accordingly, an outer optical surface 99 may be formed on the substrate 32 so that a patterned region 98 may be applied to the outer optical surface 99. The distance $d_5$ may be determined using the expression (1) so that a positive phase shift relative to a phase of the illumination radiation 14 (see FIG. 1) may be provided.

Figure 9:
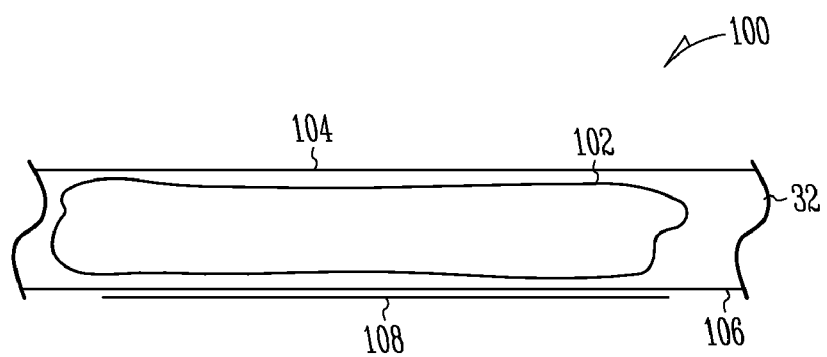
FIG. 9 is a partial cross-sectional view of an imaging mask according to the various embodiments.

FIG. 9 is a partial cross-sectional view of an imaging mask 100 according to the various embodiments. The imaging mask 100 may include an optical compensation region 102 that is interposed between a first side 104 and a second side 106 of the substrate 32. Although the mask 100 shown in FIG. 9 exhibits a patterned region 108 applied to the second side 106, it is understood that the patterned region may be alternately applied to the first side 104. In either case, the optical compensation region 102 may include a region having a different optical property than other portions of the substrate 32. Accordingly, the optical compensation region 102 may have a first optical property, while other portions of the substrate 32 may have a second optical property that is different from the first optical property. For example, the optical compensation region 102 may have a first transmissibility, while the other portions of the substrate 32 may have a second transmissibility that is different from the first transmissibility. The optical compensation region 102 may also have a first index of refraction, while the other portions of the substrate 32 may have a second index of refraction that is different from the first index of refraction.

Figure 10:
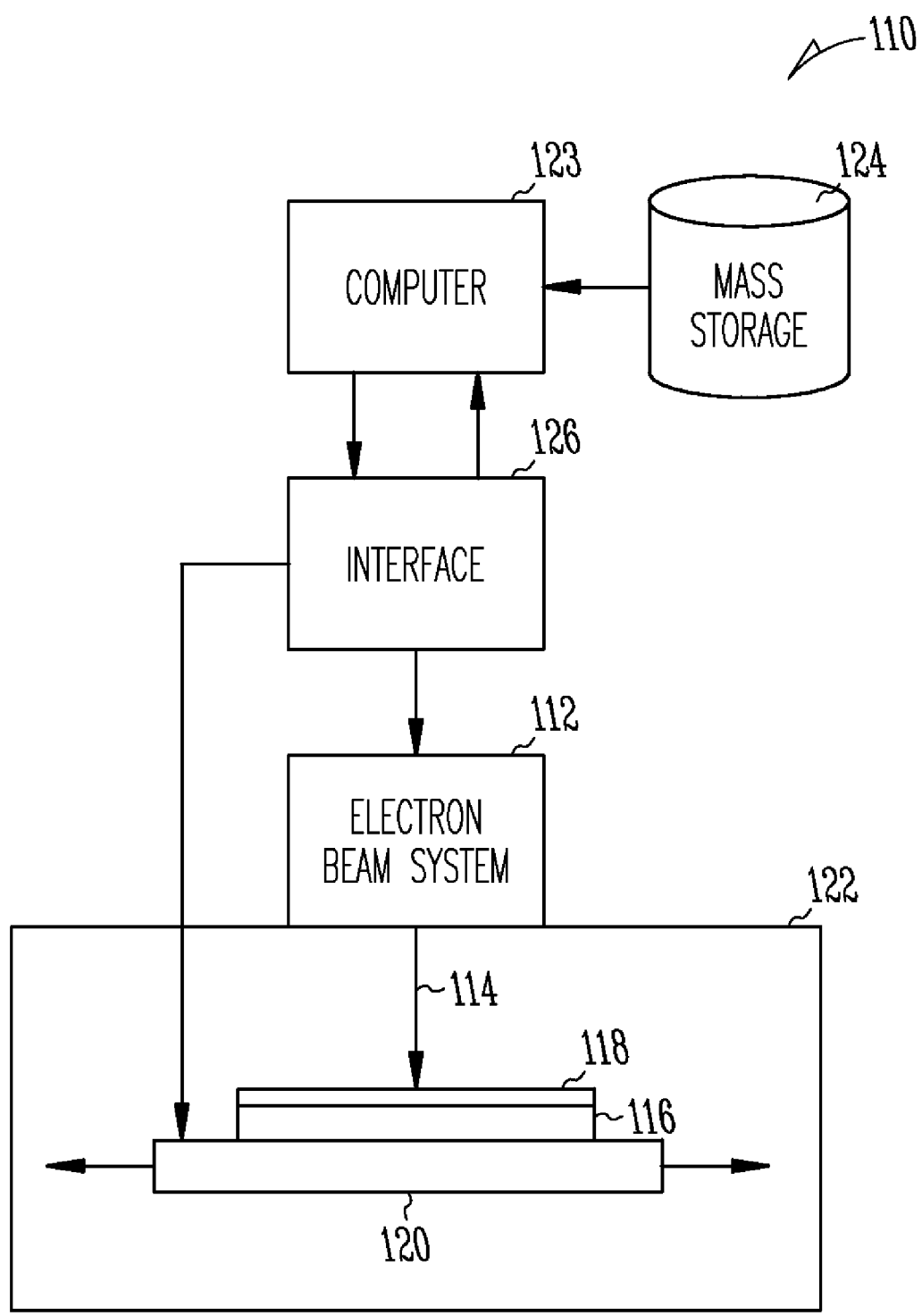
FIG. 10 is a diagrammatic block view of a mask exposure system, according to the various embodiments.

FIG. 10 is a diagrammatic block view of a mask exposure system 110, according to the various embodiments. The mask exposure system 110 may be used to fabricate an imaging mask that includes at least one of the optical compensation regions according to the various embodiments. The system 110 may include an electron beam system 112 that projects an electron beam 114 towards an imaging mask blank 116 that may have at least one surface coating 118, such as a photoresist layer.

Although not shown in FIG. 10, the electron beam system 112 may also include a beam source (such as a thermionic source, or a cold cathode source), a blanker that is configured to interrupt the beam source, a magnetic beam deflection system and/or an electrostatic deflection system that is configured to steer the electron beam 114 across a selected surface portion of the imaging mask blank 116. Since the magnetic beam deflection system and/or the electrostatic deflection system may be unable to steer the electron beam to all portions of the mask blank 116, the blank 116 may be positioned upon a stage 120 that may be translated in one or more of several (e.g., three) mutually-orthogonal directions. The system 110 may also include a vacuum chamber 122 that substantially encloses the imaging mask blank 116 and the stage 120, so that the beam 114 may be directed from the electron beam system 112 to the mask blank 116.

The system 110 may also include a computer 123, which may include any device that is capable of receiving data and programmed instructions, and to process the data according to the received instructions. Accordingly, the computer 123 may include various known devices that may range in size and capability between a mainframe device to a portable, or "laptop" device, to a simple industrial controller. The computer 123 may be coupled to a mass storage device 124 that may provide instructions and data to the computer 123. For example, the mass storage device 124 may include a disk storage device, although other suitable mass storage devices may also be used. Accordingly, the device 124 may be used to store patterning instructions, which may be executed by the computer 123 to form a desired pattern on the imaging mask blank 116.

Still referring to FIG. 10, the system 110 may include an interface 126 coupled to the computer 123 and configured to receive instructions from the computer 123. The interface 126 may be configured to translate instructions received from the computer 123 and convert the received instructions into signals that may be used to control the electron beam system 112, and to further control movements of the stage 120. Accordingly, the computer 123 and the interface 126 may cooperatively control scanning of the electron beam 114 across the surface of the imaging mask blank 116. Suitable scanning methods may include raster-scanning and vector scanning the imaging mask blank 116.

The system 110 is configured to pattern the imaging mask blank 114 by exposing the surface coating 118 to the electron beam 114, and the vacuum chamber 122 may be configured to include other operations associated with the fabrication of the imaging mask 16 (as shown in FIG. 1), such as etching with an etching apparatus (not shown in FIG. 10) that is operable to selectively etch the substrate 32 in selected optical compensation regions (as shown in FIGS. 2-9). A material deposition apparatus (not shown) may also be incorporated into the system 110, so that a selected material may be deposited onto the substrate 32 in the optical compensation region. Alternately, the system 110 may be configured to expose the imaging mask blank 116 only, with the foregoing etching and/or material deposition processes being performed at other locations.

Figure 11:
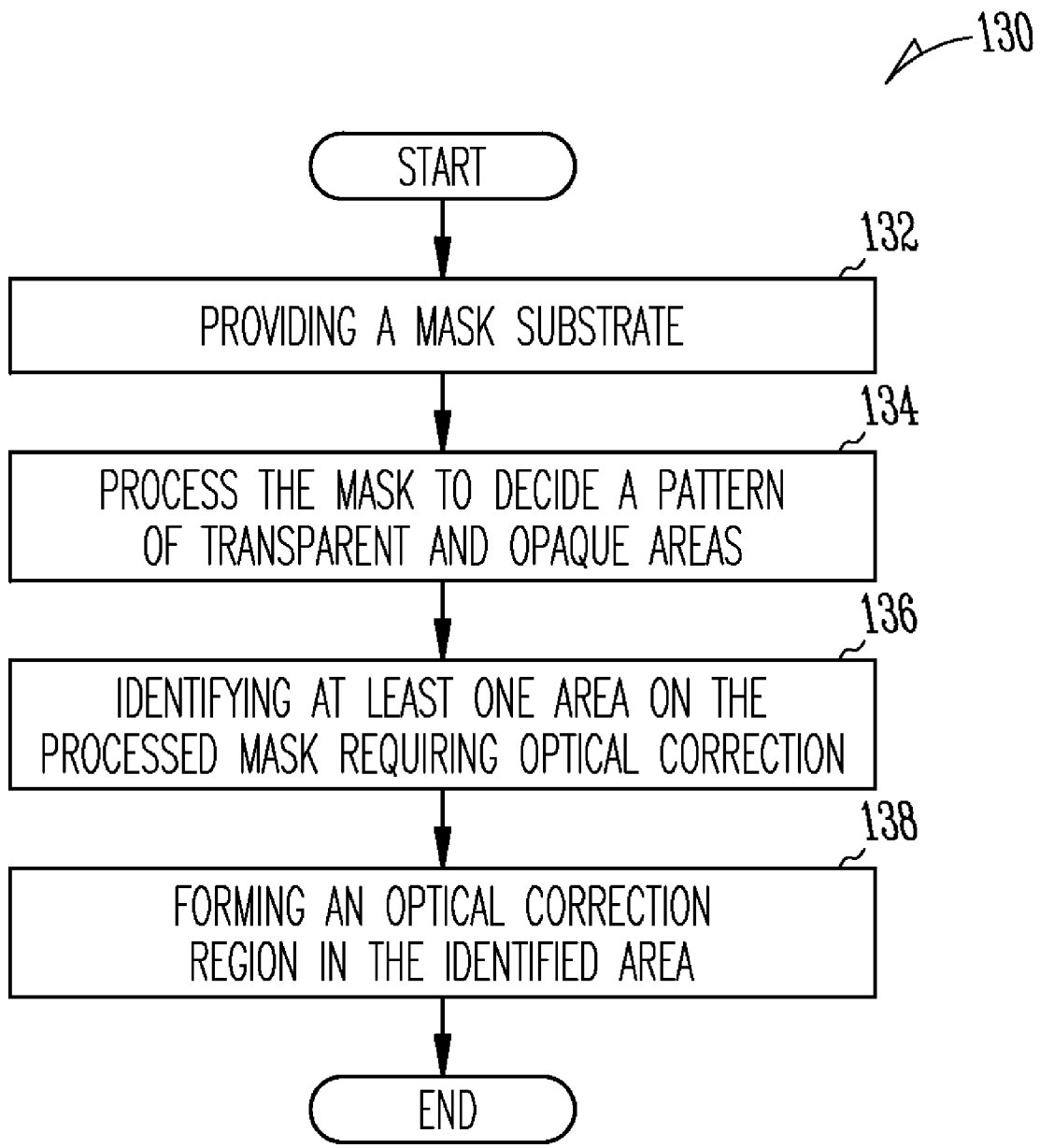
FIG. 11 is a flowchart illustrating a method of manufacturing an imaging mask, according to the various embodiments.

FIG. 11 is a flowchart illustrating a method 130 of manufacturing an imaging mask, according to the various embodiments. With continuing reference to FIGS. 10 and 11, it can be seen that the method 130 includes a block 132, wherein an imaging mask blank 116 is introduced into the system 110 of FIG. 10. The imaging mask blank 116 may comprise glass having various chemical compositions, such as quartz, or other similar materials, and may also include one or more surface layers, including metal and/or silicide layers, such as a molybdenum silicide layer, as previously described. The one or more surface layers may also include a suitable photoresist layer.

At block 134, the imaging mask blank 116 is processed to provide a desired pattern of optically transmissive and optical attenuation areas on the imaging mask blank 116. Accordingly, processing the imaging mask blank 116 may include exposing a surface of the imaging mask blank 116 to an electron beam provided by the mask exposure system 110, and developing exposed photoresist on the imaging mask blank 116 to form a desired pattern of optically transmissive and optical attenuation areas that functionally correspond to a desired pattern of features on the wafer 26 (as shown in FIG. 1).

At block 136, one or more areas on the processed mask may be selected for optical compensation. Typically, the identified or selected area includes a plurality of optically transmissive and optical attenuation features, and may further include features that are predominantly oriented in a predetermined direction, as discussed in detail in connection with FIG. 2. At block 138, the optical compensation region may be formed on the imaging mask blank 116 within the at least one area identified at block 136. The optical compensation region, which may include any of the embodiments described in connection with FIGS. 2 through 9, may be formed by selectively etching the imaging mask blank 116, or by selectively depositing a material onto the imaging mask blank 116, or by a predetermined combination of etching and deposition processes. Alternately, other operations may be performed that define the optical compensation region. As previously described, the processes conducted in block 138 may be performed within a vacuum chamber 122 of the system 110.

Figure 12:
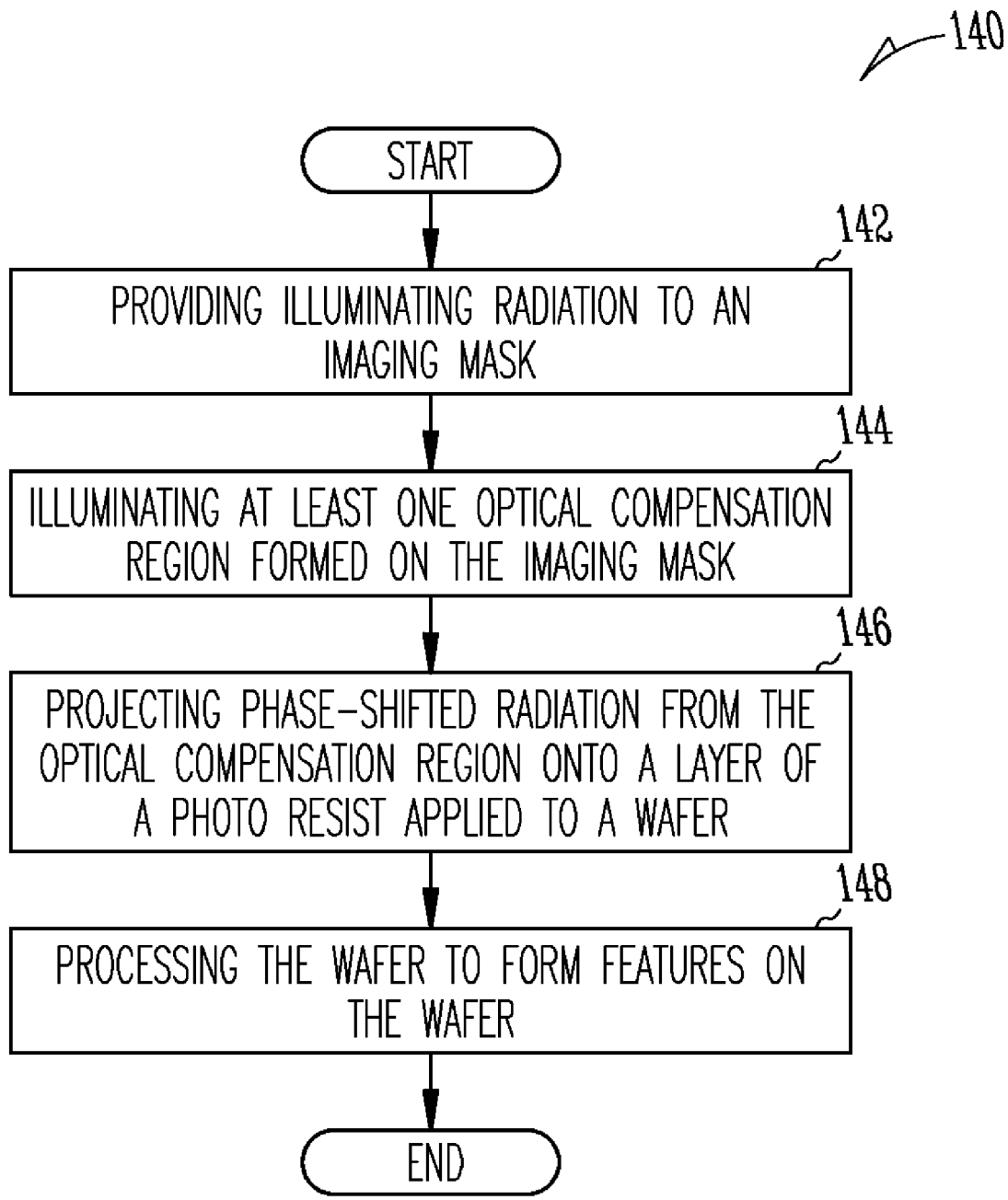
FIG. 12 is a flowchart illustrating a photolithographic method, according to the various embodiments.

FIG. 12 is a flowchart illustrating a photolithographic method 140, according to the various embodiments. Referring to FIGS. 1 and 12, it can be seen that at block 142, illuminating radiation 14 is provided to an imaging mask 16 that includes at least one of the optical compensation regions shown in FIGS. 2 through 9. The illuminating radiation 14 may be provided by a DUV source, such as an excimer laser, or it may be provided by other suitable illumination sources. At block 144, the at least one optical compensation region in the imaging mask 16 is illuminated. Accordingly, phase-adjusted imaging illumination 18 is projected from the optical compensation region and onto a photoresist layer 24 of semiconductor wafer 26 to expose the photoresist layer 24. The phase-adjusted imaging illumination 18 may be focused through a projection lens assembly 20, as previously described. At block 148, the exposed photoresist layer 24 and the wafer 26 are suitably processed to generate the desired features on the wafer 26.

While the various embodiments of the invention have been illustrated and described, as noted above, many changes can be made without departing from the scope of this disclosure. For example, although the foregoing disclosure of the various embodiments generally recites photolithography, or other similar terminology, it is understood that the various embodiments may also be used in connection with various microlithographic processes and systems without significant modification. Accordingly, the various embodiments are not to be limited to the use of DUV illumination sources, and may include the use of x-ray or electron beam sources, or still other illumination sources. Further, certain foregoing embodiments of the optical compensation regions and imaging masks may be used in the fabrication of a wide variety of semiconductor devices, which may include semiconductor memory devices, including in particular, a static memory, a dynamic memory such as a dynamic random access memory (DRAM), an extended data out dynamic random access memory (EDO DRAM), a synchronous dynamic random access memory, a double data rate synchronous dynamic random access memory (DDR SDRAM), a synchronous link dynamic random access memory (SLDRAM), a video random access memory (VRAM), a Rambus® dynamic random access memory (RDRAM), a static random access memory (SRAM), a flash memory, as well as other known memory devices.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of ordinary skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An imaging mask comprising:
   an optically transmissive substrate;
   a patterned region formed on a first side of the substrate; and
   an optical compensation region comprising a substrate portion, the optical compensation region projecting inwardly into the substrate a distance d from a second side of the substrate that opposes the first side of the substrate.

2. The imaging mask of claim 1, wherein the distance d is approximately equal to $2\lambda/\pi(n-1)$, where n is an index of refraction for the substrate, and $\lambda$ corresponds to a wavelength of radiation incident on the substrate.

3. The imaging mask of claim 1, wherein the optical compensation region is positioned to optically coincide with the patterned region.

4. The image mask of claim 1, wherein the substrate portion is configured to change a phase of the radiation incident on the patterned region by altering an optical property of the substrate.

5. The imaging mask of claim 1, wherein the optical compensation region comprises a material having a first index of refraction that is different from a second index of refraction of the substrate.

6. The imaging mask of claim 1, wherein the optical compensation region comprises a first transmissibility that is different from a second transmissibility of the substrate.

7. An imaging mask comprising:
   an optically transmissive substrate;
   a patterned region formed on a first side of the substrate; and
   an optical compensation region comprising a substrate portion, the optical compensation region projecting outwardly from the substrate a distance d from a second side of the substrate that opposes the first side of the substrate.

8. The imaging mask of claim 7, wherein the distance d is approximately equal to $2\lambda/\pi(n-1)$, where n is an index of refraction for the substrate, and $\lambda$ corresponds to a wavelength of a radiation.

9. The imaging mask of claim 7, wherein the optical compensation region comprises a material having a transmissibility that is different from a transmissibility of the substrate.

10. The imaging mask of claim 7, wherein the optical compensation region is configured to change a phase of incident radiation by a value greater than zero degrees relative to the incident radiation, and less than 180 degrees relative to the incident radiation.

11. An imaging mask comprising:
    an optically transmissive substrate;
    a patterned region formed on a first side of the substrate; and
    an optical compensation region comprising a substrate portion, the optical compensation region projecting outwardly from the substrate a distance d from the first side of the substrate.

12. The imaging mask of claim 11, wherein the distance d is approximately equal to $2\lambda/\pi(n-1)$, where n is an index of refraction for the substrate, and $\lambda$ corresponds to a wavelength of the illumination radiation.

13. The imaging mask of claim 11, wherein the optical compensation region comprises a material having an index of refraction that is different from an index of refraction of the substrate.

14. The image mask of claim 11, wherein the substrate portion is configured to change a phase of the illumination radiation incident on the patterned region by altering an optical property of the substrate.

15. The imaging mask of claim 11, wherein the optical compensation region is configured to change a phase of incident radiation by a value greater than 180 degrees relative to the incident radiation, and less than 360 degrees relative to the incident radiation.

16. An imaging mask comprising:
    an optically transmissive substrate;
    a first patterned region formed on a first side of the substrate; and
    an optical compensation region comprising a substrate portion, the optical compensation region projecting inwardly into the substrate a distance d from the first side of the substrate.

17. The imaging mask of claim 16, wherein the distance d is approximately equal to $2\lambda/\pi(n-1)$, where n is an index of refraction for the substrate, and $\lambda$ corresponds to a wavelength of the illumination radiation.

18. The imaging mask of claim 16, wherein the optical compensation region comprises a thickness greater than a thickness of the substrate.

19. The imaging mask of claim 16, wherein the optical compensation region is configured to change a phase of incident radiation by a value of approximately 90 degrees relative to the incident radiation.

20. The image mask of claim 16, further comprising:
    a second patterned region formed on the first side of the substrate, wherein the first patterned region and the second patterned region respectively comprise first features and second features, and wherein the first features of the first patterned region and the second features of the second patterned region are approximately mutually perpendicular.

* * * * *

UNITED STATES PATENT AND TRADEMARK OFFICE
CERTIFICATE OF CORRECTION

PATENT NO. : 8,323,859 B2
APPLICATION NO. : 13/299888
DATED : December 4, 2012
INVENTOR(S) : Xinya Lei et al.

It is certified that error appears in the above-identified patent and that said Letters Patent is hereby corrected as shown below:

On the Title page, in item (57), column 2, in "Abstract", line 14, delete "second" and insert -- second patterned --, therefor.

Signed and Sealed this
Sixteenth Day of July, 2013

Teresa Stanek Rea
*Acting Director of the United States Patent and Trademark Office*